(12) United States Patent
Mayer et al.

(10) Patent No.: US 12,148,502 B2
(45) Date of Patent: Nov. 19, 2024

(54) DRIVE STRENGTH CALIBRATION FOR MULTI-LEVEL SIGNALING

(71) Applicant: Micron Technology, Inc., Boise, ID (US)

(72) Inventors: Peter Mayer, Neubiberg (DE); Wolfgang Anton Spirkl, Germering (DE); Michael Dieter Richter, Ottobrunn (DE); Martin Brox, Munich (DE); Thomas Hein, Munich (DE)

(*) Notice: Subject to any disclaimer, the term of this patent is extended or adjusted under 35 U.S.C. 154(b) by 0 days.

(21) Appl. No.: 18/202,584

(22) Filed: May 26, 2023

(65) Prior Publication Data

US 2023/0386527 A1     Nov. 30, 2023

Related U.S. Application Data

(63) Continuation of application No. 17/882,478, filed on Aug. 5, 2022, now Pat. No. 11,688,435, which is a
(Continued)

(51) Int. Cl.
*G11C 7/22* (2006.01)
*G11C 5/14* (2006.01)
(Continued)

(52) U.S. Cl.
CPC .............. *G11C 5/147* (2013.01); *G11C 5/148* (2013.01); *G11C 7/1063* (2013.01);
(Continued)

(58) Field of Classification Search
CPC ....... G11C 5/147; G11C 5/148; G11C 7/1063; G11C 7/1069; G11C 7/109; G11C 7/1096;
(Continued)

(56) References Cited

U.S. PATENT DOCUMENTS 6,772,351 B1 *   8/2004   Werner ............... G11C 8/10
                                                    710/110
7,308,058 B2    12/2007   Zerbe et al.
(Continued)

FOREIGN PATENT DOCUMENTS

CN         1545097 A      11/2004
CN       101729056 A       6/2010
(Continued)

OTHER PUBLICATIONS

Chinese patent office, "China Office Action," issued in connection with China Patent Application No. 201980052529.9 dated Nov. 9, 2023 (21 pages) (8 pages of English Translation and 13 pages of Original Document).
(Continued)

*Primary Examiner* — Kurtis R Bahr

(57) ABSTRACT

Methods, systems, and devices for drive strength calibration for multi-level signaling are described. A driver may be configured to have an initial drive strength and to drive an output pin of a transmitting device toward an intermediate voltage level of a multi-level modulation scheme, where the output pin is coupled with a receiving device via a channel. The receiving device may generate, and the transmitting device may receive, a feedback signal indicating a relationship between the resulting voltage of the channel and an value for the intermediate voltage level. The transmitting device may determine and configure the driver to use an adjusted drive strength for the intermediate voltage level based on the feedback signal. The driver may be calibrated (e.g., independently) for each intermediate voltage level of the multi-level modulation scheme. Further, the driver may be calibrated for the associated channel.

17 Claims, 7 Drawing Sheets

Related U.S. Application Data continuation of application No. 17/241,876, filed on Apr. 27, 2021, now Pat. No. 11,443,779, which is a continuation of application No. 16/538,376, filed on Aug. 12, 2019, now Pat. No. 10,998,011.

(60) Provisional application No. 62/720,287, filed on Aug. 21, 2018.

(51) Int. Cl.
    *G11C 7/10*     (2006.01)
    *G11C 11/22*     (2006.01)
    *G11C 11/56*     (2006.01)

(52) U.S. Cl.
CPC ............ *G11C 7/1069* (2013.01); *G11C 7/109* (2013.01); *G11C 7/1096* (2013.01); *G11C 11/221* (2013.01); *G11C 11/2273* (2013.01); *G11C 11/56* (2013.01); *G11C 11/5657* (2013.01)

(58) Field of Classification Search
CPC ... G11C 11/221; G11C 11/2273; G11C 11/56; G11C 11/5657
See application file for complete search history.

(56) References Cited

U.S. PATENT DOCUMENTS

| | | | |
|---|---|---|---|
| 7,505,541 | B1 | 3/2009 | Brunn et al. |
| 8,199,859 | B2 | 6/2012 | Zerbe et al. |
| 9,369,128 | B1 | 6/2016 | Tan et al. |
| 9,998,305 | B2 | 6/2018 | Zerbe et al. |
| 10,658,986 | B2 * | 5/2020 | Takeuchi .................. H03F 3/45 |
| 2002/0091948 | A1 | 7/2002 | Werner et al. |
| 2003/0001611 | A1 | 1/2003 | Dour |
| 2005/0005179 | A1 | 1/2005 | Werner et al. |
| 2005/0057291 | A1 | 3/2005 | Nguyen et al. |
| 2005/0134305 | A1 | 6/2005 | Stojanovic et al. |
| 2005/0134307 | A1 | 6/2005 | Stojanovic et al. |
| 2006/0203900 | A1 | 9/2006 | Koralek |
| 2008/0088365 | A1 | 4/2008 | Jang |
| 2009/0097338 | A1 | 4/2009 | Werner et al. |
| 2009/0296484 | A1 | 12/2009 | Wang et al. |
| 2009/0298457 | A1 * | 12/2009 | Jakobs ..................... H03F 3/72 |
| | | | 375/317 |
| 2010/0001758 | A1 | 1/2010 | Dreps et al. |
| 2010/0090750 | A1 | 4/2010 | Kim |
| 2013/0064281 | A1 | 3/2013 | Raphaeli et al. |
| 2013/0195155 | A1 | 8/2013 | Pan et al. |
| 2014/0043069 | A1 | 2/2014 | Oh et al. |
| 2014/0191802 | A1 | 7/2014 | Li et al. |
| 2015/0023104 | A1 | 1/2015 | Tanzawa |
| 2016/0162214 | A1 | 6/2016 | McCall et al. |
| 2016/0188775 | A1 | 6/2016 | Tanzawa |
| 2016/0254931 | A1 | 9/2016 | Jung |
| 2017/0345483 | A1 | 11/2017 | Wang |
| 2018/0183516 | A1 | 6/2018 | Moision et al. |
| 2018/0248577 | A1 | 8/2018 | Hossain et al. |
| 2020/0084069 | A1 | 3/2020 | Rane |
| 2020/0118609 | A1 * | 4/2020 | Brox ........................ G11C 7/14 |

FOREIGN PATENT DOCUMENTS

| | | |
|---|---|---|
| CN | 103259512 A | 8/2013 |
| CN | 104283518 A | 1/2015 |
| CN | 105027432 A | 11/2015 |
| KR | 10-2014-0028904 A | 3/2014 |
| WO | 01/50228 A2 | 7/2001 |
| WO | 02/21782 A2 | 3/2002 |

OTHER PUBLICATIONS

European Search Report and Search Opinion received for EP Application No. 19851272.5, mailed on Nov. 3, 2021, 8 pages.
International Search Report and Written Opinion received for PCT Patent Application No. PCT/US19/46409, mailed on Dec. 5, 2019, 11 pages.
Korean Patent Office, "Office Action", issued in connection with Korean Patent Application No. 10-2022-7035230 dated Nov. 28, 2022 (8 pages) (4 pages of English Translation and 4 pages of Original Document).
Office Action received for Korean Patent Application No. 10-2021-7007263, mailed on Jan. 13, 2022, 11 pages (6 pages of English Translation and 5 pages of Original Document).

* cited by examiner

DRIVE STRENGTH CALIBRATION FOR MULTI-LEVEL SIGNALING

CROSS REFERENCE

The present application for patent is a continuation of U.S. patent application Ser. No. 17/882,478 by Mayer et al., entitled "DRIVE STRENGTH CALIBRATION FOR MULTI-LEVEL SIGNALING," filed Aug. 5, 2022, which is a continuation of U.S. patent application Ser. No. 17/241,876 by Mayer et al., entitled "DRIVE STRENGTH CALIBRATION FOR MULTI-LEVEL SIGNALING," filed Apr. 27, 2021, which is a continuation of U.S. patent application Ser. No. 16/538,376 by Mayer et al., entitled "DRIVE STRENGTH CALIBRATION FOR MULTI-LEVEL SIGNALING," filed Aug. 12, 2019, which claims priority to U.S. Provisional Patent Application No. 62/720,287 by Mayer et al., entitled "DRIVE STRENGTH CALIBRATION FOR MULTI-LEVEL SIGNALING," filed Aug. 21, 2018, each of which is assigned to the assignee hereof and is expressly incorporated by reference in its entirety.

BACKGROUND

The following relates generally to a system that includes at least one memory device and more specifically to drive strength calibration for multi-level signaling of a memory device.

Memory devices are widely used to store information in various electronic devices such as computers, wireless communication devices, cameras, digital displays, and the like. Information is stored by programing different states of a memory device. For example, binary devices may store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

Non-binary modulation schemes, in which modulation symbols each represent more than one bit of information, may be referred to, as multi-level modulation schemes, and signaling techniques in accordance with such modulation schemes may be referred to as multi-level signaling. Some memory devices may use multi-level signaling to exchange information with other devices, and drivers may be used to drive multi-level signals across communications channels. Solutions for calibrating the drive strength of a driver for multi-level signaling may be desired.

DETAILED DESCRIPTION

Figure 1:
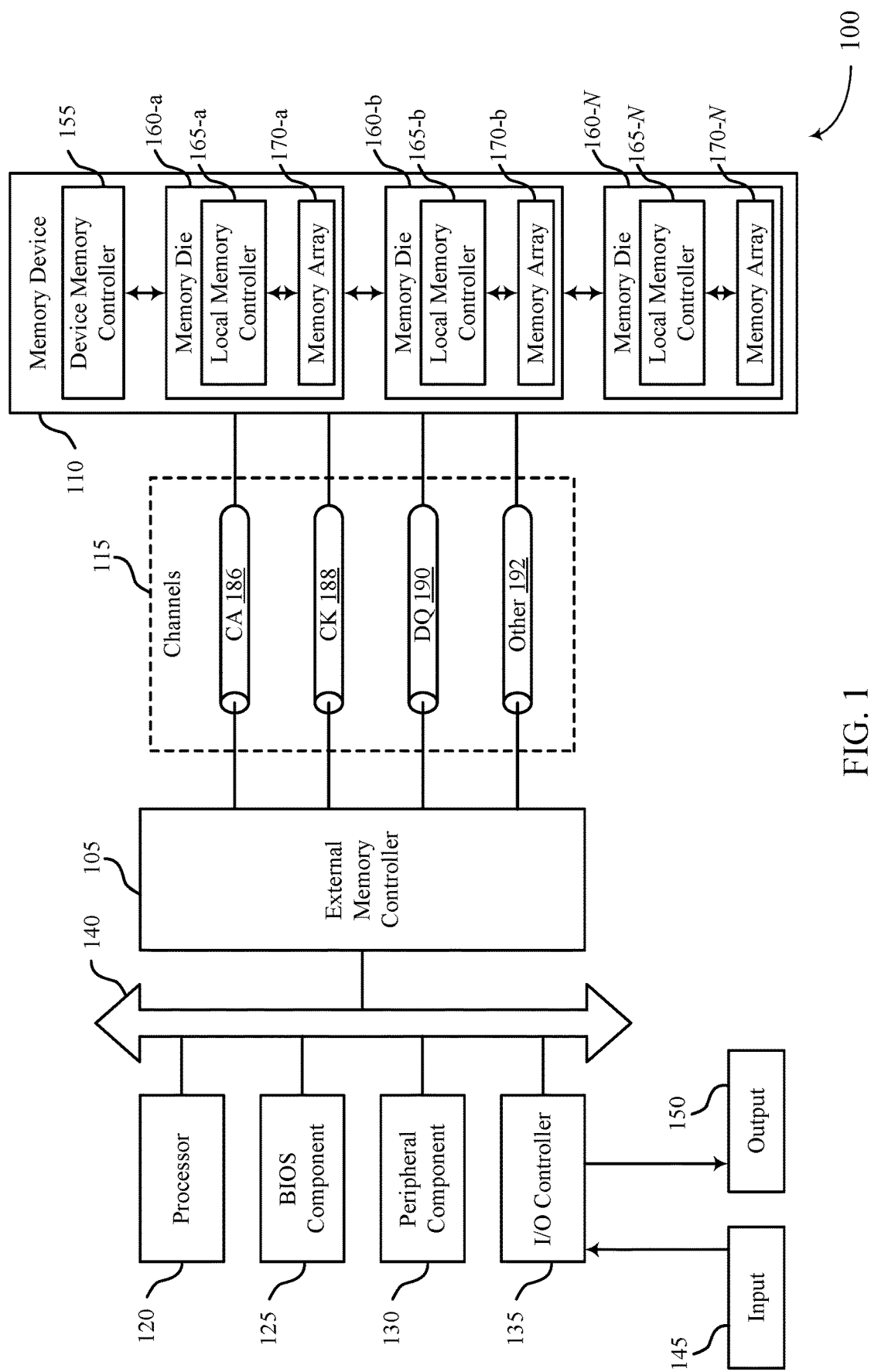
FIG. 1 illustrates an example of a system that supports drive strength calibration for multi-level signaling in accordance with the teachings herein.

A memory device may communicate with another device (e.g., a host device for the memory device such as a graphics processing unit (GPU), general purpose GPU (GPGPU), central processing unit (CPU), or other device) over one or more communications channels using multi-level signaling (e.g., signaling that is modulated using a modulation scheme that includes at least three levels to encode more than one bit of information per modulation symbol). Such a channel may couple a pin of the memory device with a pin of the other device. For example, the channel may be a data channel and may couple a data pin (e.g., DQ pin) of the memory device with a corresponding pin of the other device.

The channel may be unidirectional or bi-directional, and the memory device may act as a transmitting device for some access operations (e.g., for read operations) or as a receiving device for some access operations (e.g., for write operations), or both, with the other device correspondingly acting as a receiving device or a transmitting device for some access operations. The transmitting device—whether the memory device or the other device—may drive the channel using a driver. The driver may be configured (e.g., calibrated or trained) for multi-level (e.g., non-binary) signaling in accordance with the techniques described herein. For example, the drive strength (e.g., impedance) of the driver may be calibrated independently for each symbol (e.g., voltage level) of the modulation scheme used for multi-level signaling, independently of other drivers for other channels, or both.

For example, the transmitting device may configure the driver to drive the channel (e.g., by driving an output pin of the transmitting device) toward a desired voltage level in accordance with a multi-level modulation scheme. The driver may drive the channel toward the desired voltage level using an initial drive strength (e.g., a default or other initial drive strength associated with the desired voltage level), and the receiving device may provide a feedback signal that indicates a resulting voltage of the channel relative to a reference voltage (e.g., a target or ideal voltage) for the desired voltage level.

The transmitting device may determine an adjusted (e.g., calibrated) drive strength for the driver specific to the desired voltage level based on the feedback signal. For example, the transmitting device may adjust (e.g., sweep) the drive strength of the driver until the feedback signal indicates that the voltage of the channel has reached or crossed the reference voltage (e.g., transitioned from being less than the reference voltage to being greater than or equal to the reference voltage, or from being greater than the reference voltage to being less than or equal to the reference voltage). The transmitting device may determine the adjusted drive strength for the desired voltage level based on (e.g., as whether it is equal to) the drive strength corresponding to (e.g., concurrent with, coincident with, or otherwise resulting in) the voltage of the channel reaching, exceeding, or crossing the reference voltage.

The transmitting device may configure the driver to use (e.g., have, be set at) the adjusted drive strength when later driving the channel to (or toward) the desired voltage level of the modulation scheme. For example, the transmitting device may store (e.g., in a mode register) an indication of the adjusted drive strength.

In some cases, the driver may comprise multiple legs, each leg being associated with (e.g., having) a corresponding amount of impedance, and the transmitting device may adjust the drive strength by adjusting the quantity of selected (e.g., activated) legs of the driver. In some such cases, the transmitting device may store (e.g., as an indication of the adjusted drive strength) the quantity of legs of the driver to select when subsequently driving the channel to (or toward) the desired voltage level of the modulation scheme.

The driver may later and independently be similarly calibrated for one or more other voltage levels of the modulation scheme. For example, the driver may be calibrated (e.g., independently) for at least some if not each intermediate voltage level of the multi-level modulation scheme (e.g., each voltage level of the modulation scheme other than the lowest and highest voltage levels). Independent calibration of the driver for at least some if not each intermediate voltage level may beneficially compensate for non-linearities of the driver (e.g., a non-linear impedance) across the range of voltage levels of the modulation scheme. Further, the driver may be calibrated independent of any other driver, which may beneficially compensate for variations across channels (e.g., variations in channel impedance or other channel characteristics). Thus, the techniques herein may improve (e.g., normalize, equalize, increase, or maximize) data eye margins for one or more symbols (e.g., voltage levels) of the modulation scheme, which may, for example, improve the reliability and data rate (e.g., baud rate or bit rate) of multi-rate signaling over the channel. These and other benefits of the disclosure will be appreciated by one of ordinary skill in the art.

Features of the disclosure are described below in the context of a memory system and device with reference to FIGS. 1 and 2. Features of the disclosure are further described in the context of devices, systems, and processes for drive strength calibration for multi-level signaling with reference to FIGS. 3 through 5. These and other features of the disclosure are further illustrated by and described with reference to FIGS. 6 and 7, which include flowcharts that relate to drive strength calibration for multi-level signaling.

FIG. 1 illustrates an example of a system 100 that includes devices that support drive strength calibration for multi-level signaling in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be a component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors. In some cases, the memory device 110 may support calibration of drivers used by the memory device 110 or by another device (e.g., the external memory controller 105) to communicate over channels 115 using multi-level signaling.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be coupled with or in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a GPU, a GPGPU, a CPU, or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components as would be understood by persons of ordinary skill in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that may provide information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some cases, system 100 may include multiple drivers—such as off-chip drivers (OCDs)—which each may be coupled with or included in a device (e.g., the external memory controller 105 or the memory device 110) and used by the device to drive signals (e.g., multi-level signals) over a channel 115.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are further described with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs, increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105.

For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like. In some cases, the device memory controller 155 may support calibration of drivers used by the memory device 110 or by another device (e.g., the external memory controller 105) to communicate over channels 115 using multi-level signaling.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120. Thus, in some cases, the device memory controller 155 may support calibration of drivers used by the memory device 110 or by another device (e.g., the external memory controller 105) to communicate over channels 115 using multi-level signaling (e.g., signaling that is modulated using a modulation scheme that includes at least three levels to encode more than one bit of information per modulation symbol).

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal. In some cases, the external memory controller 105 may support calibration of drivers used by the memory device 110 or by another device (e.g., the external memory controller 105) to communicate over channels 115 using multi-level signaling.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. Although the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

In some cases, channels 115 may be coupled with one or more drivers, which may be configured to drive multi-level signals over channels 115. The drivers may be coupled with (and in some cases included in) a device of the system 100, such as the external memory controller 105 or the memory device 110. The channels 115 may also each comprise one or more terminations configured to promote signal integrity. For example, a channel 115 may be low-level terminated (e.g., coupled via a resistive or other element to a ground reference or other voltage reference corresponding to a lowest voltage level of a modulation scheme) or high-level terminated (e.g., coupled via a resistive or other element to a supply voltage or other voltage reference corresponding to a highest logic level of a modulation scheme). In some cases, a driver may be configured to drive multi-level signals over a channel 115 when a device coupled with the driver acts as a transmitting device and configured to provide a high- or low-level termination for the channel 115 when the device coupled with the driver acts as a receiving device.

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to adjust (e.g., oscillate) between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (e.g., DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. Although the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths. In some cases, an EDC channel may be configured to carry a feedback signal, such as a feedback signal related to the calibration of drivers used by the memory device 110 or another device (e.g., the external memory controller 105) to communicate over channels 115 using multi-level signaling.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal (e.g., a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, devices that communicate via channels 115 using a multi-level modulation scheme may engage in a calibration (or training) routine to independently configure the drive strength of one or more associated drivers for one or more intermediate voltage levels of the multi-level modulation scheme. Doing so may equalize and thereby increase or maximize the separation between different voltage levels of the multi-level modulation scheme as driven during operation. For example, in a PAM4 modulation scheme the drive strength of a driver may be independently calibrated for two intermediate voltages levels. More specifically in a PAM4 modulation scheme a lowest voltage (which may be referred to as L0) may comprise a first symbol and represent a first non-binary logic value (e.g., 00), a first intermediate voltage (which may be referred to as L1) may comprise a second symbol and represent a second non-binary logic value (e.g., 01), a second intermediate voltage (which may be referred to as L2) may comprise a third symbol and represent a third non-binary logic value (e.g., 10), and a highest voltage (which may be referred to as L3) may comprise a fourth symbol and represent a fourth non-binary logic value (e.g., 11). In some examples, the drive strength of a driver may be independently calibrated for L1, L2, or both. The lowest and highest voltages described herein, and particularly with reference to FIG. 3B, may be low or high relative to other reference voltages or signal levels in the system; such voltages may not be the lowest or highest voltages available or used by other parts of system 100.

Figure 2:
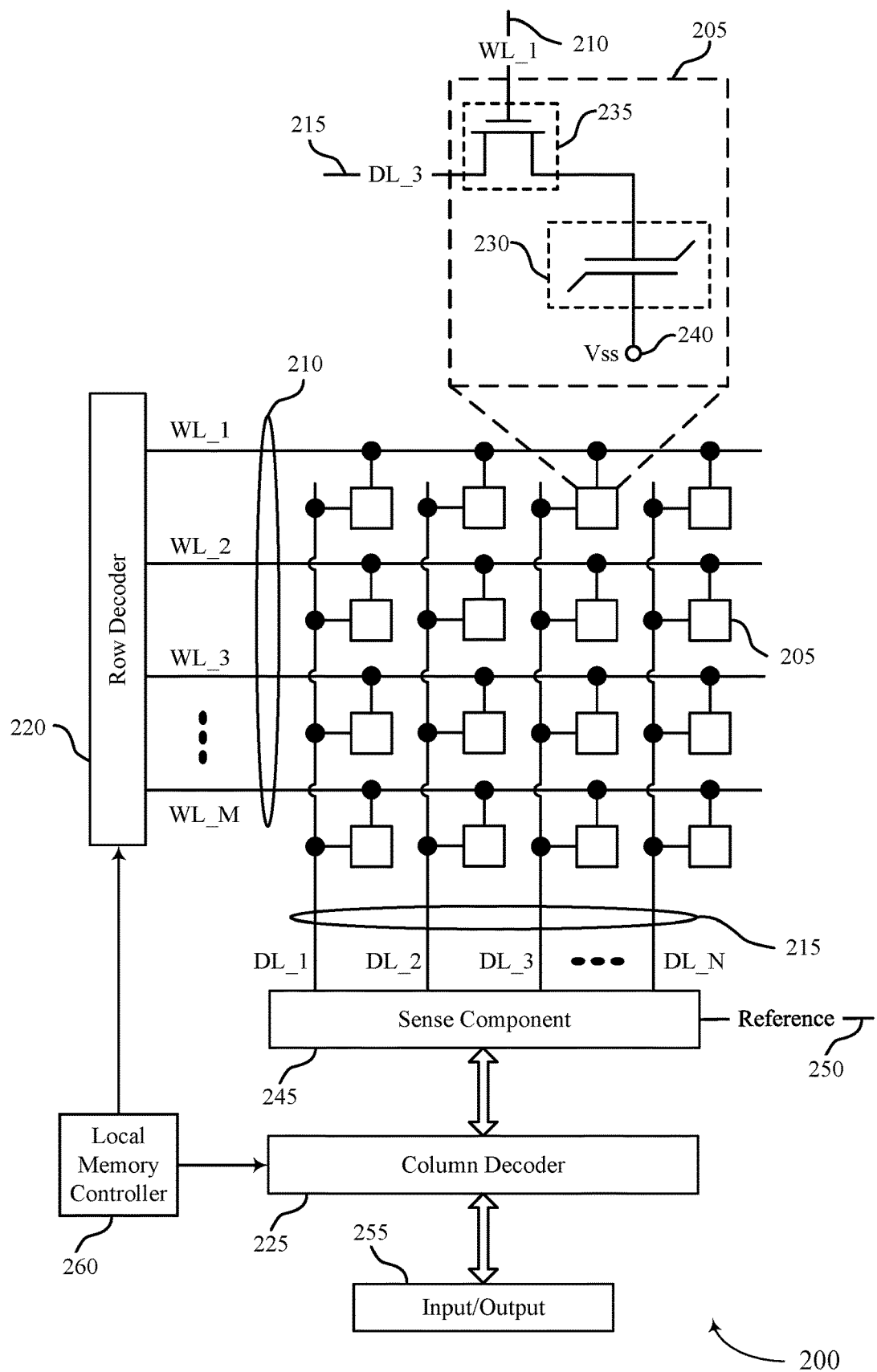
FIG. 2 shows a block diagram of a device that supports drive strength calibration for multi-level signaling in accordance with the teachings herein.

FIG. 2 illustrates an example of a memory die 200 that supports drive strength calibration for multi-level signaling in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. In DRAM architectures, a memory cell 205 may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver. The switching component 235 may be an example of a transistor or any other type of switch device that selectively establishes or de-establishes (e.g., ceases) electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 may be or include a transistor and its operation may be controlled by applying a voltage to the transistor gate, where the voltage differential between the transistor gate and transistor source may be greater or less than a threshold voltage of the transistor. In some cases, the switching component 235 may be or include a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that may be used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge.

During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0.

The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a first signal (e.g., voltage) to the digit line 215 during the write operation to store a first state (e.g., charge) in the capacitor 230 of the memory cell 205, and the first state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205.

The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

The memory die 200 illustrates a two-dimensional (2D) array of memory cells. In some cases, the memory device may include three-dimensional (3D) arrays or memory cells. A 3D memory array may include two or more 2D memory arrays stacked on top of one another. In some cases, 2D memory arrays in a 3D memory array may be referred to as decks, levels, layers, or dies. A 3D memory array may include any quantity of stacked 2D memory arrays (e.g., two high, three high, four high, five high, six high, seven high, eight high). This may increase the quantity of memory cells that may be positioned on a single die or substrate as compared with a single 2D memory array, which in turn may reduce production costs, increase the performance of the memory array, or both. In some 3D memory arrays, different decks may share at least one common access line such that some decks may share at least one of a word line 210 or a digit line 215.

Memory die 200 may include or be in electronic communication with one or more drivers for communicating with another device (e.g., a host device for a memory device 110 that includes memory die 200) using a multi-level modulation scheme. For example, data read from memory cells 205 may be communicated to the host device via one or more data (e.g., DQ) channels 190 using the multi-level modulation scheme, and data written to memory cells 205 may be received from the host device via one or more data channels 190 using the multi-level modulation scheme, and each data channel 190 may be driven by an associated driver. In accordance with the techniques described herein, local memory controller 260 or another controller included in or coupled with a memory device 110 that includes memory die 200 (e.g., a device memory controller 155) may manage a calibration (or training) routine, from the perspective of either a transmitting device or a receiving device, to independently configure the drive strength of the one or more drivers for one or more intermediate voltage levels of the multi-level modulation scheme.

Figure 3A:
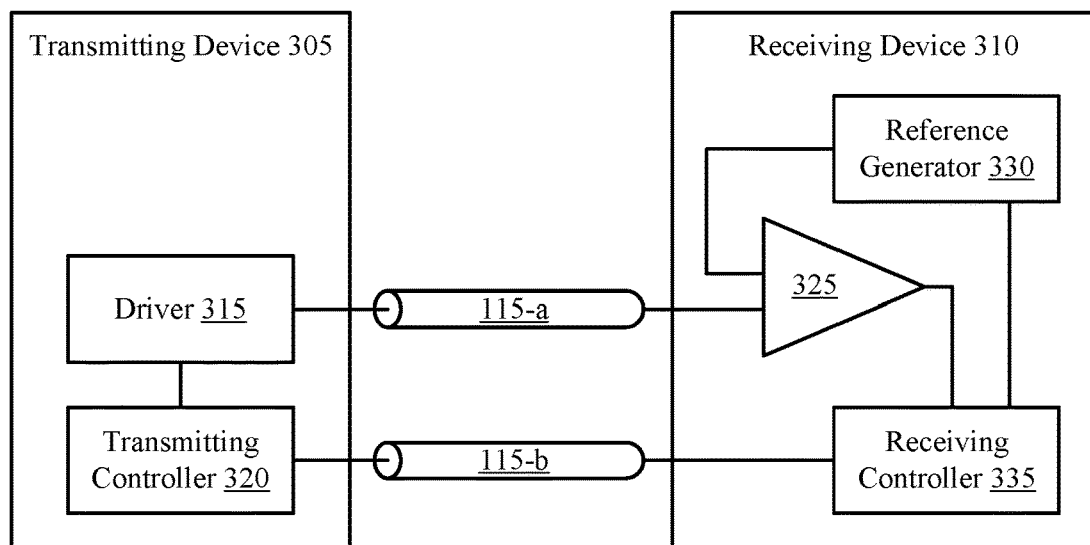
FIG. 3A shows a block diagram of a system that supports drive strength calibration for multi-level signaling in accordance with the teachings herein.
Figure 3B:
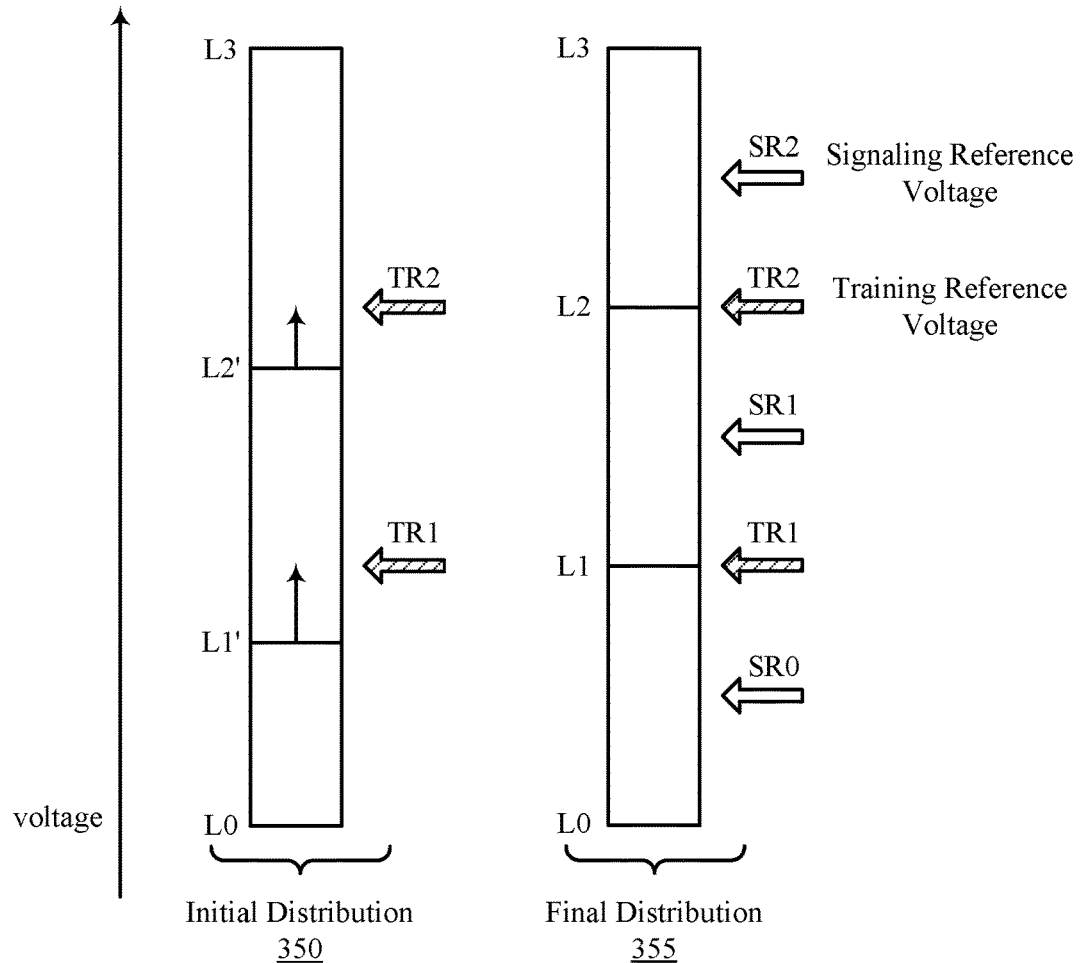
FIG. 3B illustrates voltage distributions associated with drive strength calibration for multi-level signaling in accordance with the teachings herein.

FIGS. 3A and 3B respectively illustrate an example of a driver calibration (or training) system 300-a and example voltage distributions 300-b for an associated driver calibration process, both of which support drive strength calibration for multi-level signaling in accordance with various examples of the present disclosure. The driver calibration system 300-a may include a transmitting device 305 and a receiving device 310, each of which may implement aspects of the driver calibration process associated with voltage distributions 300-b.

The transmitting device 305 and the receiver each may be an example of a device as described with reference to FIG. 1. For example, the transmitting device 305 may be an example of an external memory controller 105 (e.g., a GPU), and the receiving device 310 may be an example of a memory device 110 (e.g., a graphics double data rate (GDDR) memory device), or vice versa. In some cases, a single device may at times act as a transmitting device 305 and at times act as a receiving device 310.

For illustrative clarity, the transmitting device 305 and the receiving device 310 are shown in the example of driver calibration system 300-a as each coupled with one another via a first channel 115-a and a second channel 115-b, but it is to be understood that the transmitting device 305 and the receiving device 310 may be coupled with one another and may exchange signals via any quantity of one or more channels 115. In some cases, the first channel 115-a may be an example of a data channel 190 as described with reference to FIG. 1, and the second channel 115-b may be an example of an EDC channel as described with reference to FIG. 1, but it is to be understood that the first channel 115-a and the second channel 115-b may each be any kind (e.g., same or different) of channel 115.

The transmitting device 305 may include a driver 315 and a transmitting controller 320. The transmitting controller 320 may be coupled with the driver 315 (e.g., via a bus or any other type of connection). In some cases, the transmitting controller 320 may include or be implemented by aspects of one or more of an external memory controller 105, a device memory controller 155, a local memory controller 165, or a processor 120, as described with reference to FIG. 1.

The transmitting controller 320 may be operable to configure and operate the driver 315, including to calibrate (e.g., train) and configure the drive strength of the driver 315 and to cause the driver 315 to drive the first channel 115-a to or toward a desired voltage level of a multi-level modulation (or signaling) scheme. Though shown in the example of driver calibration system 300-a as included within the transmitting device 305, it is to be understood that the driver 315 may in some cases be partially or entirely external to the transmitting device 305. In some cases, the driver 315 may be an OCD.

The driver 315 may be coupled with the first channel 115-a and may be configured to drive the first channel 115-a to various voltages in accordance with a modulation scheme. For example, the driver 315 may be coupled with an output pin of the transmitting device 305 that is included in the first channel 115-a, and the driver 315 may drive the first channel 115-a to a voltage by driving the output pin to the voltage.

The driver 315 may have a configurable (e.g., adjustable) drive strength. The drive strength of the driver 315 may correspond to a configurable (e.g., adjustable) impedance (e.g., output or source impedance) of the driver 315. In some cases, the drive strength of the driver 315 may be correlated with (e.g., inversely proportional) to the output impedance of the driver 315—that is, a decreased output impedance may correspond to an increased drive strength of the driver 315, and an increased output impedance may correspond to a decreased drive strength of the driver 315.

The receiving device 310 may include a comparison circuit 325, a reference generator 330, and a receiving controller 335. The comparison circuit 325 may be coupled with the reference generator 330 and the receiving controller 335, and the reference generator 330 may also be coupled with the receiving controller 335.

The comparison circuit 325 may be coupled with the first channel 115-a and may be configured to sense the voltage of the first channel 115-a (e.g., by sensing the voltage of an input pin of the receiving device 310 that is included in the first channel 115-a). The comparison circuit 325 may also be configured to sense a reference voltage generated by the reference generator 330, and to compare the voltage of the first channel 115-a to the reference voltage. In some cases, the comparison circuit 325 may comprise a comparator. The comparison circuit 325 may generate an output signal based on comparing the voltage of the first channel 115-a to the reference voltage. For example, the comparison circuit 325 may generate an output signal that indicates whether the voltage of the first channel 115-a is higher than or lower than the reference voltage.

The receiving controller 335 may determine a desired reference voltage and may be operable to configure the reference generator 330 to generate the desired reference voltage, which may be a signaling reference voltage or a training reference voltage, or any other kind of reference voltage. The receiving controller 335 may receive the output signal generated by the comparison circuit 325 and may generate a feedback signal based on the output signal. The receiving controller 335 may be coupled with the second channel 115-b and may transmit the feedback signal to the transmitting controller 320, which may also be coupled with the second channel 115-b, via the second channel 115-b. The feedback signal may indicate whether the voltage of the first channel 115-a is higher than or lower than the reference voltage.

Additionally or alternatively, in some cases, the feedback signal may indicate a symbol (e.g., a logic value) interpreted by the receiving device 310 (e.g., by the receiving controller 335) based on the voltage of the first channel 115-a. In some cases, the receiving controller 335 may include or be implemented by aspects of one or more of an external memory controller 105, a device memory controller 155, a local memory controller 165, or a processor 120, as described with reference to FIG. 1.

In some cases, the driver 315 may undergo calibration for multi-level signaling in accordance with the techniques described herein. For example, FIG. 3B illustrates example voltage distributions 300-b for a driver calibration process in the context of a PAM4 modulation scheme. In the example PAM4 modulation scheme, a lowest voltage level L0 comprises a first symbol and represents a first non-binary logic value (e.g., 00), a first intermediate voltage level L1 may comprises a second symbol and represents a second non-binary logic value (e.g., 01), a second intermediate voltage level L2 comprises a third symbol and represents a third non-binary logic value (e.g., 10), and a highest voltage level L3 comprises a fourth symbol and represents a fourth non-binary logic value (e.g., 11).

Voltage L0 may be any voltage level configured to be interpreted by a system (e.g., a system 100 as described with reference to FIG. 1) as the lowest voltage level of the modulation scheme. In some cases, L0 may correspond to a ground reference or a lowest (whether negative or non-negative) supply voltage of the system. In some cases, L0 may correspond to a voltage level in between the ground reference or lowest (whether negative or non-negative) supply voltage of the system and highest supply voltage of the system. For example, L0 may correspond to a non-negative voltage between ground and the highest supply voltage of the system (e.g., the highest supply voltage of the system may be 1.2V, and L0 may be 0.6V). In some cases, the driver 315 may be calibrated for L0 (e.g., the strength of the driver 315 when driving a channel 115 to L0 may be calibrated) based on an external resistor, which may be a high-precision external resistor.

Voltage L3 may be any voltage configured to be interpreted by the system as the highest voltage level of the modulation scheme, and thus, in a PAM4 modulation scheme, may be a fourth voltage level that is higher than the other three voltage levels of the modulation scheme. In some cases, L3 may correspond to the highest supply voltage of the system, which may be referred to as VDD (e.g., VDD may be 1.2V, and L3 may be 1.2V). In some cases, calibrating the driver 315 for generate L3 (e.g., calibrating the strength of the driver 315 when driving the channel to L3) may be unnecessary, as the channel 115 may be high-level terminated. In other cases, calibrating the driver 315 for generate L0 (e.g., calibrating the strength of the driver 315 when driving the channel to L0) may be unnecessary, as the channel 115 may be low-level terminated, and the driver 315 may be calibrated for L3 (e.g., the strength of the driver 315 when driving a channel 115 to L3 may be calibrated) based on an external resistor, which may be a high-precision external resistor.

Voltage L1 and voltage L2 may each be any voltage configured to be interpreted by the system as an intermediate voltage level of the modulation scheme (e.g., between L0 and L3). In some cases, ideal or target values for L1 or L2 may be determined based at least in part on L0 and L3. For example, either the transmitting controller 320 or the receiving controller 335 (or both) may determine target values for L1 and L2. The target values for L1 and L2 may be values that result in a uniform spacing of modulating symbols of the operative modulation scheme (e.g., voltage levels that are evenly or uniformly distributed in voltage, meaning separated by uniform voltage differences) and thus may be obtained based on the difference between the highest voltage level of the modulation scheme and the lowest voltage of the modulation scheme and the quantity of intermediate voltages of the modulation scheme. For example, in the example of FIG. 3B, if L0 is 0.6V and L3 is 1.2V, then a target value for L1 may be 0.8V and a target value for L2 may be 1.0V, as these values for L1 and L2 result in each of L0, L1, L2, and L3 being separated from any immediately higher or lower voltage level by the same voltage difference 0.2V. In some cases, the voltage separation between voltage levels of a modulation scheme may be referred to as a symbol height, and thus the target values for intermediate voltage levels such as L1 and L2 may be those that result in a uniform (e.g., matched, substantially identical, within a threshold range, or otherwise desired) symbol height for one or more symbols of the modulation scheme.

Before calibration in accordance with the techniques described herein, the driver 315 may produce voltage levels in accordance with initial distribution 350. For example, when the driver 315 drives the first channel 115-a to L1 using an initial drive strength for L1, the resulting voltage of the first channel 115-a may be L1', and when the driver 315 drives the first channel 115-a to L2 using an initial drive strength for L2, the resulting voltage of the first channel 115-a may be L2'.

In some cases, the driver 315 may have a non-linear impedance at different output voltages, and thus, the modulation symbols (e.g., voltage levels) of initial distribution 350 may be non-uniformly spaced (e.g., evenly or uniformly distributed in voltage, meaning separated by uniform voltage differences). For example, a greater voltage difference may exist between L2' and L3 than between L1' and L2', and a greater voltage difference may exist between L1' and L2' than between L0 and L1'. In some cases, a calibration process in accordance with the techniques herein may conform (or at least improve the conformance of) the intermediate voltage levels of the modulation scheme as generated by the driver 315 with the corresponding target (or ideal) values and thereby equalize (and thus increase or maximize) the data eye margin for each associated modulation symbol.

The calibration process may use one or more training reference voltages, which may be voltage references corresponding to the target values of the intermediate voltage levels. For example, as shown in FIG. 3B, training reference voltage TR1 may correspond to the target value of L1 (e.g., 0.8V), and training reference voltage TR2 may correspond to the target value of L2 (e.g., 1.0V). The receiving controller 335 may determine the target values for L1 and L2 or receive an indication of the target value for L1 and L2 from the transmitting controller 320. The receiving controller 335 may configure each training reference voltage to align with the respective target value. In some cases, the target values of L1 and L2 and thus the respective training reference voltages may be preconfigured and stored (e.g., through trim parameters, mode registers, or fuse settings at the transmitting device 305 or receiving device 310).

Calibration of the driver 315 may progress through the one or more intermediate voltage levels of the modulation scheme in any order. For example, as one option the driver 315 may first be trained with a first voltage level (e.g., a highest or lowest intermediate voltage level), and training may then progress through other intermediate voltage levels in order of decreasing or increasing voltage. In some cases, the transmitting controller 320 may determine an initial voltage level for training and an order of voltage level for training based on a voltage level trained based on a precision external resistor (e.g., if a lowest voltage level of the modulation scheme is trained based on the precision external resistor, the transmitting controller 320 may determine the lowest intermediate voltage level as the initial voltage level for training, and if a highest voltage level of the modulation scheme is trained based on the precision external resistor, the transmitting controller 320 may determine the highest intermediate voltage level as the initial voltage level for training).

In some cases, the driver 315 may first be trained with respect to L1. The transmitting controller 320 may configure the driver 315 to drive the first channel 115-a to L1 using an initial (e.g., default) drive strength for L1. The receiving controller 335 may configure the reference generator 330 to generate a reference voltage corresponding to TR1 (e.g., 0.8V). The driver 315 may drive the first channel 115-a (e.g., by driving an associated output pin of the transmitting device 305) toward L1, using the initial drive strength, for one or more symbol durations or burst lengths, and the comparison circuit 325 may compare the resulting voltage of the first channel 115-a (e.g., by monitoring the voltage of an associated input pin of the receiving device 310) to the reference voltage corresponding to TR1.

The voltage of the first channel 115-*a* as driven by the driver 315 using the initial drive strength for L1—that is, L1'—may be higher or lower than the target value for L1. For example, L1' may be lower than TR1 by some amount, as shown in initial distribution 350. The comparison circuit 325 may transmit to the receiving controller 335 an indication that the voltage of the first channel 115-*a* is different (e.g., lower) than TR1, and the receiving controller 335 may transmit to the transmitting controller 320 a feedback signal indicating that the voltage of the first channel 115-*a* is different (e.g., lower) than TR1.

The transmitting controller 320 may adjust the drive strength of the driver 315 (e.g., by adjusting the impedance of the driver 315) based on the feedback signal. For example, if the feedback signal indicates that the voltage of the first channel 115-*a* is lower than TR1, the transmitting controller 320 may adjust the drive strength of the driver 315 so as to increase the voltage of the first channel 115-*a* (conversely, if the feedback signal indicates that the voltage of the first channel 115-*a* is higher than TR1, the transmitting controller 320 may adjust the drive strength of the driver 315 so as to decrease the voltage of the first channel 115-*a*).

Upon receiving a feedback signal indicating that the voltage of the first channel 115-*a* has reached or crossed (transitioned from less than to greater than, or from greater than to less than) the value of TR1, the transmitting controller 320 may determine the corresponding drive strength as an adjusted drive strength (e.g., impedance) that the driver 315 is to use when driving the first channel 115-*a* to L1. In some cases, the feedback signal may indicate that the voltage of the first channel 115-*a* has reached or crossed the value of TR1 by changing state or logic value (e.g., the voltage at an input pin of the transmitting device 305 that is included in the second channel 115-*b* may change from a first level to a second level).

In subsequent operation, when driving the first channel 115-*a* to L1, the driver 315 may be configured (e.g., by the transmitting controller 320) to use (e.g., have) the adjusted drive strength (e.g., adjusted impedance). Thus, as shown in final distribution 355, the value of the L1 when driven by the driver 315 using the adjusted drive strength may align with TR1 (at least to a greater degree than L1' in initial distribution 350).

After being trained for L1, the driver 315 may be trained for L2. The transmitting controller 320 may configure the driver 315 to drive the first channel 115-*a* to L2 using an initial (e.g., default) drive strength for L2. The receiving controller 335 may configure the reference generator 330 to generate a reference voltage corresponding to TR2 (e.g., 1.0V). The driver 315 may drive the first channel 115-*a* (e.g., by driving an associated output pin of the transmitting device 305) toward L2, using the initial drive strength for L2, for one or more symbol durations or burst lengths, and the comparison circuit 325 may compare the resulting voltage of the first channel 115-*a* (e.g., by monitoring the voltage of an associated input pin of the receiving device 310) to the reference voltage corresponding to TR2.

The voltage of the first channel 115-*a* as driven by the driver 315 using the initial drive strength for L2—that is, L2'—may be higher or lower than the target value for L2. For example, L2' may be lower than TR2 by some amount, as shown in initial distribution 350. The comparison circuit 325 may transmit to the receiving controller 335 an indication that the voltage of the first channel 115-*a* is different (e.g., lower) than TR2, and the receiving controller 335 may transmit to the transmitting controller 320 a feedback signal indicating that the voltage of the first channel 115-*a* is different (e.g., lower) than TR2.

The transmitting controller 320 may adjust the drive strength of the driver 315 (e.g., by adjusting the impedance of the driver 315) based on the feedback signal. For example, if the feedback signal indicates that the voltage of the first channel 115-*a* is lower than TR2, the transmitting controller 320 may adjust the drive strength of the driver 315 so as to increase the voltage of the first channel 115-*a* (conversely, if the feedback signal indicates that the voltage of the first channel 115-*a* is higher than TR2, the transmitting controller 320 may adjust the drive strength of the driver 315 so as to decrease the voltage of the first channel 115-*a*).

Upon receiving a feedback signal indicating that the voltage of the first channel 115-*a* has reached or crossed (transitioned from less than to greater than, or from greater than to less than) the value of TR2, the transmitting controller 320 may determine the corresponding drive strength as an adjusted drive strength (e.g., impedance) that the driver 315 is to use when driving the first channel 115-*a* to L2. In some cases, the feedback signal may indicate that the voltage of the first channel 115-*a* has reached or crossed the value of TR2 by changing state or logic value (e.g., the voltage at an input pin of the transmitting device 305 that is included in the second channel 115-*b* may change from a first level to a second level).

In subsequent operation, when driving the first channel 115-*a* to L2, the driver 315 may be configured (e.g., by the transmitting controller 320) to use (e.g., have) the adjusted drive strength (e.g., adjusted impedance). Thus, as shown in final distribution 355, the value of the L2 when driven by the driver 315 using the adjusted drive strength may align with TR2 (at least to a greater degree than L2' in initial distribution 350).

In some cases, when calibrating the driver 315 for a given voltage level (e.g., L1 or L2), the transmitting controller 320 may sweep (e.g., adjust the strength progressively in one direction) the strength (e.g. impedance) of the driver 315 while driving the first channel 115-*a*. In some examples, this may occur with the comparison circuit 325 monitoring (e.g., continuously) the resulting voltage of the first channel 115-*a* and the receiving controller 335 providing (e.g., continuously) a feedback signal, until the feedback signal changes state (e.g., logical value).

In some cases, when calibrating the driver 315 for a given voltage level (e.g., L1 or L2), the transmitting controller 320 may adjust the strength (e.g., impedance) of the driver 315 in stepwise fashion according to one or more discrete increments, and the receiving controller 335 may provide a discrete feedback signal for each increment. For example, the transmitting controller 320 may receive a first feedback signal for the initial drive strength of the driver 315, then adjust the drive strength of the driver 315 by a first discrete increment, receive a second corresponding feedback signal, then adjust the drive strength of the driver 315 by a second discrete increment (e.g., identical in magnitude to the first discrete increment or based on (proportional to) a difference between the voltage of the first channel 115-*a* and the target value as may be indicated by the first feedback signal), then receive a third corresponding feedback signal, and so on, until the transmitting controller 320 receives a feedback signal indicating that the voltage of the first channel 115-*a* has reached or crossed the target value for the given voltage level (e.g., TR1 or TR2).

In some cases, the second channel 115-*b* may include a pin (e.g., an EDC pin) at the transmitting device 305, and the feedback signal may comprise a high or low voltage at the pin. Thus, thus the transmitting controller 320 may adjust the strength (e.g. impedance) of the driver 315—either by sweeping (e.g., continuously) or in discrete increments—until detecting a change in voltage at the pin (e.g., a change from the low voltage to the high voltage at the pin), as the change in voltage at the pin may indicate that the voltage of the first channel 115-a has reached or crossed the target value for the given voltage level (e.g., TR1 or TR2).

In some cases, the transmitting device 305 may be a memory device, and the receiving device 310 may be a host device for the memory device (e.g., a GPU), and the receiving device 310 may control and adjust the drive strength of the driver 315 (e.g., by setting one or more mode registers of the memory device). In some cases, the receiving device 310 may determine when the voltage of the first channel 115-a reaches or crosses the value of the training reference voltage for the intermediate voltage level, determine the adjusted drive strength of the driver for the intermediate voltage level based on the voltage of the first channel 115-a reaching or crossing the value of the training reference voltage for the intermediate voltage level, and configure the driver 315 to thereafter use the adjusted drive strength for the intermediate voltage level (e.g., store the adjusted drive strength at a mode register of the memory device). Thus, in some cases, there may be no feedback signal sent, or alternatively, the feedback signal may comprise the receiving device 310 setting the adjusted drive strength at the transmitting device 305 or an indication of the adjusted drive strength (which, as drive strength and the voltage of the first channel 115-a are related, may comprise an indication of the voltage of the first channel 115-a when driven using the initial drive strength relative to the training reference voltage).

In some cases, the driver 315 may be trained as part of a post-manufacturing process for the transmitting device 305 (e.g., the receiving device 310 may be a test device) or an assembly process for a system that includes both the transmitting device 305 and the receiving device 310. In some cases, the driver 315 may be trained as part of a boot or reboot sequence for the transmitting device 305. For example, the transmitting controller 320 may detect a boot or reboot of the transmitting device 305 and may initiate a calibration sequence that includes the techniques described herein.

In some cases, the transmitting device 305 may include one or more mode registers (e.g., included in or otherwise in communication with the transmitting controller 320), and the transmitting controller 320 may store in a mode register an indication of the adjusted drive strength (e.g., adjusted impedance) to be used by the driver 315 when generating a desired voltage level of the modulation scheme.

It is to be understood that the driver calibration techniques described herein may be used for any quantity of voltage levels (e.g., intermediate voltage levels) of any multi-level modulation scheme. Further, although the example of driver calibration system 300-a illustrated in FIG. 3A illustrates a single driver 315, it is further to be understood that a transmitting device 305 may include any quantity of drivers 315 and that each driver 315 may be trained (e.g., individually or a part of a group) in accordance with the techniques described herein. In some cases, the transmitting device 305 and the receiving device 310 may exchange one or more signals to coordinate which driver 315 is being trained and for which intermediate voltage level during a given time interval. Further, in some cases, multiple drivers 315 may be trained (e.g., concurrently, simultaneously). It is further to be understood that any absolute values (e.g., for various voltage levels) used herein are merely exemplary and included for the sake of illustrative clarity.

In operation, the receiving device 310 may determine the logic value represented by a voltage of the first channel 115-a based on a comparison to one or more signaling reference voltages, which may be generated by the reference generator 330 and may be different than any training reference voltage. For example, if the voltage of the first channel 115-a is below a first signaling reference voltage SR0, the receiving device 310 may determine that the logic value corresponds to that of L0 (e.g., 00). As another example, if the voltage of the first channel 115-a is above the first signaling reference voltage SR0 and below a second signaling reference voltage SR1, the receiving device 310 may determine that the logic value corresponds to that of L1 (e.g., 01). As another example, if the voltage of the first channel 115-a is above the second signaling reference voltage SR1 and below a third signaling reference voltage SR2, the receiving device 310 may determine that the logic value corresponds to that of L2 (e.g., 10). As another example, if the voltage of the first channel 115-a is above a third signaling reference voltage SR2, the receiving device 310 may determine that the logic value corresponds to that of L3 (e.g., 11).

As shown by final distribution 355, training reference voltages may be configured to be at a midpoint between adjacent signaling reference voltages. For example, in terms of voltage, TR1 may be equidistant from SR0 and SR1, while TR2 may be equidistant from SR1 and SR2. Thus, calibration of a driver 315 in accordance with the techniques described herein may beneficially configure the driver 315 to drive a pin or other aspect of a channel 115 such that different voltages of the multi-level modulation scheme are equally separated in voltage (if signaling reference voltages are also equally separated in voltage), or at least at a midpoint between signaling reference voltages, and to thereby increase or maximize the data eye margin of the different symbols of the modulation scheme. This may reduce error rates and thereby increase effective data rates. Further, calibrating drivers 315 independently of one another for each voltage level may compensate for variations in the linearity of a single driver 315 or across different drivers 315 and may also compensate for variations across different channels 115.

Figure 4:
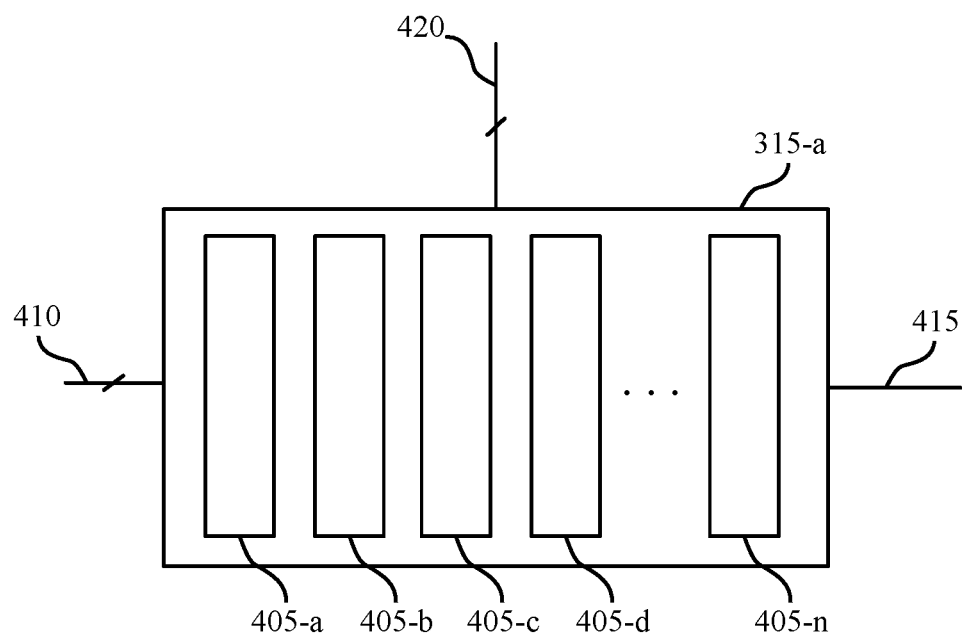
FIG. 4 shows a block diagram of a device that supports drive strength calibration for multi-level signaling in accordance with the teachings herein.

FIG. 4 shows an example of a driver 315-a that supports drive strength calibration for multi-level signaling in accordance with various examples of the present disclosure. The driver 315-a may be configured to receive an input signal 410 and output (e.g., drive) an output signal 415 based on the input signal 410. The driver 315-a may comprise multiple legs 405 (which may alternatively be referred to as fingers). In some cases, the driver 315-a may receive and be configured by a control signal 420.

In some cases, each leg 405 may comprise one or more transistors configured to drive the output signal 415 based on the input signal 410. For example, each leg 405 may comprise a p-type (e.g. PMOS) transistor and an n-type (e.g., NMOS) transistor arranged in a push-pull configuration, or in some other amplifier configuration.

The input signal 410 may comprise one or more bit streams. In some cases, the output signal 415 may be a multi-level signal in accordance with an M-ary multi-level modulation scheme. In some cases, the input signal 410 may comprise $\log_2(M)$ parallel bit streams. For example, the output signal 415 may be a PAM4 signal, and the input signal 410 may comprise two parallel bit streams. For each bit stream included in the input signal 410, at least some of the legs 405 (e.g., a subset of the legs 405 or all of the legs 405) may be configured to each receive the bit stream as an input and drive the output signal 415 based on the bit stream.

Each leg 405 may have an associated impendence (e.g., source or output impedance). In some cases, the quantity of selected legs 405 used to drive the output signal 415—which may be referred to as active legs—may be dynamically configurable (e.g., selectable) based on the control signal 420. For example, the control signal 420 may comprise an indication (e.g., a number), which may specify and control the quantity of active legs 405.

In some cases, the legs 405 may be in parallel with one another, and increasing the quantity of active legs 405 may decrease the impedance (e.g., source or output impedance) of the driver 315-a, which may also be referred to as increasing the strength of the driver 315-a. Similarly, decreasing the quantity of active legs 405 may increase the impedance of the driver 315-a, which may also be referred to as decreasing the strength of the driver 315-a.

In some cases, the control signal 420 may be generated by and received from a controller, such as a transmitting controller 320 as described with reference to FIG. 3A. In some cases, the transmitting controller 320 may adjust the impedance of the driver 315-a—e.g., in connection with driver calibration techniques as described herein—by varying the control signal 420 and thus the quantity of active legs 405 of the driver 315-a.

Figure 5:
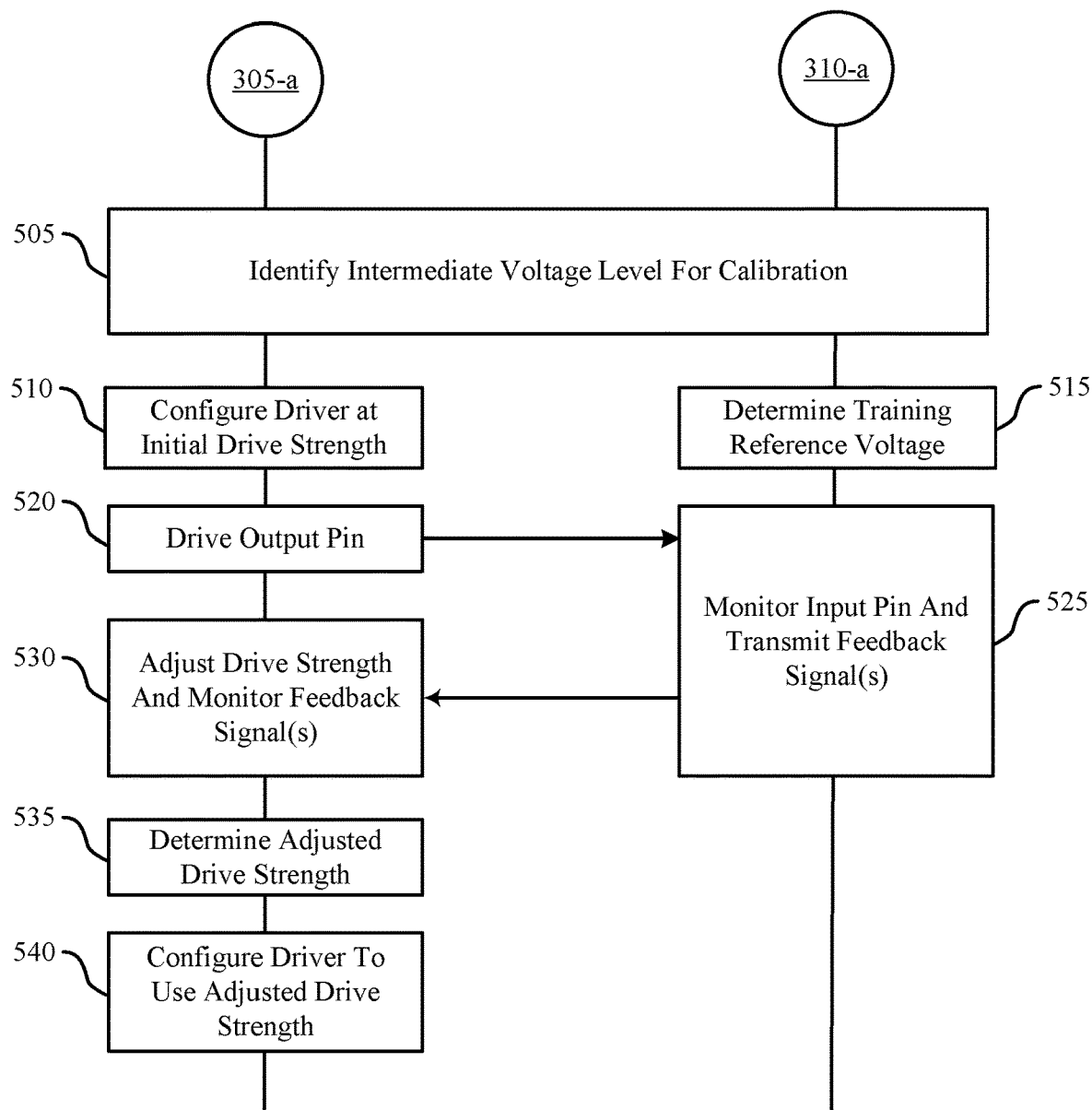
FIG. 5 illustrates a process that supports drive strength calibration for multi-level signaling in accordance with the teachings herein.

FIG. 5 illustrates a process 500 that supports drive strength calibration for multi-level signaling in accordance with various examples of the present disclosure. In some examples, process 500 may be implemented by a transmitting device 305-a, a receiving device 310-a, or both, which may be examples of a transmitting device 305 and a receiving device 310 as described with reference to FIG. 3A.

At 505, the transmitting device 305-a and the receiving device 310-a may identify an intermediate voltage level of a multi-level modulation scheme for calibration, such as L1 or L2 of a PAM4 modulation scheme. In some cases, the transmitting device 305-a may identify the intermediate voltage level and signal the identified intermediate voltage level to the receiving device 310-a. In some cases, the receiving device 310-a may identify the intermediate voltage level and signal the identified intermediate voltage level to the transmitting device 305-a.

At 510, the transmitting device 305-a may configure a driver 315 to have an initial drive strength associated with the intermediate voltage level identified at 505. In some cases, the initial drive strength may represent an initial or default impedance of the driver 315 for the intermediate voltage level identified at 505. The initial drive strength may be determined based on a mode register or fuse setting of the transmitting device, or may be determined by a controller at the transmitting device (e.g., a transmitting controller 320) based on one or more factors such as a range of possible drive strengths and a relationship between the intermediate voltage level identified at 505 and the highest and lowest levels of the modulation scheme (e.g., if the intermediate voltage level is L1 of a PAM4 modulation scheme, the initial drive strength may be ⅓ removed from the maximum or minimum drive strength of the driver 315, depending on whether a corresponding channel 115 is low-level or high-level terminated, as the target value for L1 may higher than L0 by an amount of voltage equal to ⅓ of the difference between L3 and L0).

At 515, the receiving device 310-a may determine a training reference voltage for the intermediate voltage level identified at 505. For example, a controller at the receiving device 310-a (e.g., a receiving controller 335) may determine the training reference voltage relative to a target or ideal voltage level (e.g., as equal to a target or ideal voltage level) to ensure uniform distribution of the voltage levels of the modulation scheme across the voltage range of the modulation scheme (e.g., a difference in voltage between L3 and L0). Thus, the receiving device 310-a may at 310 determine the training reference voltage (e.g., based on absolute value of and the difference the highest and lowest levels of the modulation scheme and/or the quantity of voltage levels of the modulation scheme). In some cases, the transmitting device 305-a may determine a training reference voltage for the intermediate voltage level identified at 505 and signal the determined training reference voltage to the receiving device 310-a.

At 520, the transmitting device 305-a may drive an output pin (e.g., a DQ pin of a memory device, or a pin coupled via a channel 115 with a DQ pin of a memory device) toward the intermediate voltage level identified at 505 using the initial drive strength as configured at 510.

At 525, the receiving device 310-a may monitor an input pin of the receiving device 310-a (e.g., a pin coupled via a channel 115 with a DQ pin of a memory device, or a DQ pin of a memory device) and transmit a feedback signal to the transmitting device 305-a. In some cases, monitoring the input pin may include comparing the voltage of the input pin to a reference voltage equal to the training reference voltage determined at 515, and the feedback signal may indicate whether the voltage of the input pin (and thus of the output pin driven at 515) relative to (e.g., less than, greater than, equal to) the training reference voltage determined at 515. In some cases the feedback signal may be transmitted at least in part via an EDC pin of a memory device.

At 530, the transmitting device 305-a may adjust the drive strength of the driver 315 and monitor the feedback signal. In some cases, the transmitting device 305-a may adjust the drive strength of the driver 315 (e.g., sweep the drive strength of the driver 315) while monitoring the feedback signal in real time. In some cases, the transmitting device 305-a may adjust the drive strength of the driver 315 (e.g., in discrete increments) and monitor for distinct feedback signals associated with reach respective increment. The transmitting device 305-a may adjust the drive strength until the transmitting device detects a change (e.g., a change in logic value or symbol value of the feedback signal, which may in some cases correspond to a change of voltage at a pin via which the transmitting device 305-a receives the feedback signal). Adjusting the drive strength of the driver 315 may, in some cases, include adjusting the impedance of the driver 315, which may include adjusting a quantity of active legs 405 of the driver 315 (e.g., by adjusting a control signal 420) as described with reference to FIG. 4.

At 535, the transmitting device 305-a may determine an adjusted drive strength (e.g., adjusted impedance) of the driver 315 for the intermediate voltage level identified at 505. The adjusted drive strength may be a drive strength that the driver 315 is to use (e.g., have or be configured at) when driving the output pin at the intermediate voltage level identified at 505. The transmitting device 305-a may determine the adjusted drive strength as the drive strength of the driver 315 that is concurrent with or otherwise corresponds to (e.g., results in) the transmitting device 305 detecting the change to the feedback signal monitored at 530.

At 540, the transmitting device may configure the driver 315 to use (e.g., have or be set at) the adjusted drive strength determined at 535 when subsequently driving the output pin at the intermediate voltage level identified at 505. In some cases, configuring the driver 315 at 540 may comprise setting a mode register or other storage mechanism to store the adjusted drive strength determined at 535, which may include storing a quantity (e.g., a number) of legs 405 of the driver 315 to select and thereby render active when subsequently driving the output pin at the intermediate voltage level identified at 505 (e.g., by storing an associated value of the control signal 420).

Although the example illustrated in FIG. 5 is described with reference to calibrating the drive strength of a single pin for a single voltage level, it is to be understood that a calibration process in accordance with the teachings described herein (e.g., process 500) may be repeated for any quantity of intermediate voltage levels and for any quantity of drivers 315 and associated pins and channels 115. Further, it is to be understood that multiple drivers 315 may be calibrated (e.g., concurrently, simultaneously, serially). Further, calibrating drivers 315 independently of one another for each voltage level may compensate for variations in the linearity of a single driver 315 or across different drivers 315 and may also compensate for variations across different channels 115.

In some cases, when the calibration process is complete for an intermediate voltage level, the transmitting device 305-*a* may transmit an indication that the calibration process is complete for the intermediate voltage level. For example, the voltage of a channel 115 (such as the channel 115 that carries the feedback signal or any other channel 115) may be set or toggled, a specific sequence of symbols may be sent over the channel 115 driven by the driver 315 undergoing calibration, or a mode register of the receiving device 310-*a* may be set, among other operations.

Figure 6:
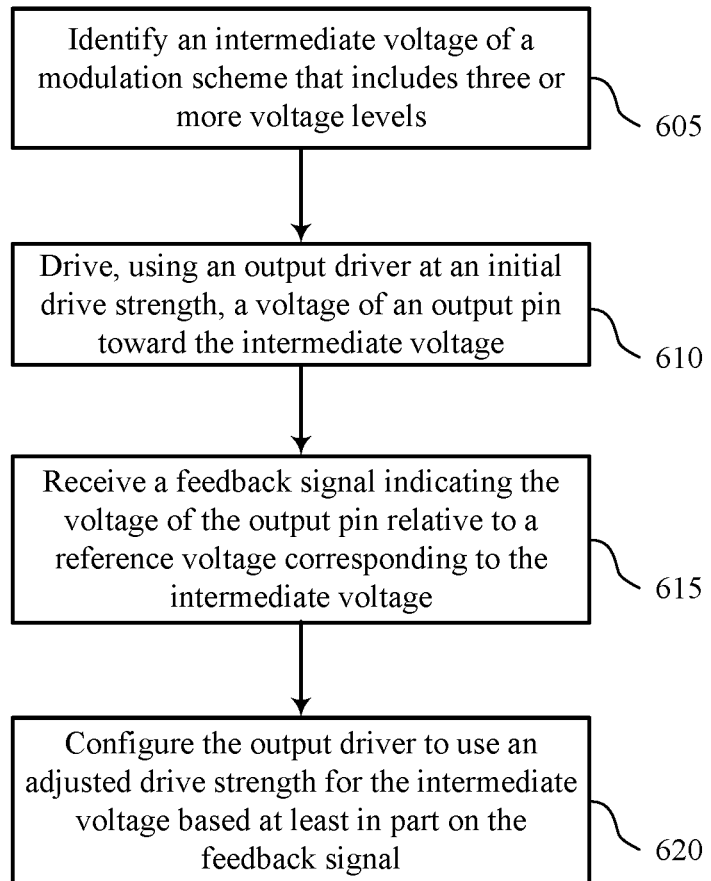
FIGS. 6 through 7 illustrate a method or methods that support drive strength calibration for multi-level signaling in accordance with the teachings herein.

FIG. 6 shows a flowchart illustrating a method 600 that supports drive strength calibration for multi-level signaling in accordance with aspects disclosed herein. The operations of method 600 may be implemented by a controller or its components as described with reference to FIGS. 1-5. For example, the operations of method 600 may be performed by a transmitting controller 320 as described with reference to FIG. 3A. In some examples, the controller may execute a set of codes to control the functional elements of a device (e.g., a transmitting device 305, which may comprise a memory device 110 or a host device for the memory device 110) to perform the functions described below.

At 605 the controller may identify an intermediate voltage of a modulation scheme that includes three or more voltage levels. The operations of 605 may be performed according to the methods described with reference to FIGS. 1-5. In certain examples, the modulation scheme may be a PAM4 modulation scheme, and the intermediate voltage level may be either a second-lowest or second-highest voltage level of the modulation scheme (e.g., L1 or L2).

At 610 the controller may drive, using an output driver at an initial drive strength, a voltage of an output pin toward the intermediate voltage generate an internal data clock signal for the first memory die. The operations of 610 may be performed according to the methods described with reference to FIGS. 1-5. In certain examples, the output driver may be a driver 315 as described herein, and the output pin may be included in or otherwise coupled with a channel 115 as described herein. In some examples, the output pin may be a DQ pin.

At 615 the controller may receive a feedback signal indicating the voltage of the output pin relative to a reference voltage corresponding to the intermediate voltage. The operations of 615 may be performed according to the methods described with reference to FIGS. 1-5. In certain examples, the reference voltage may be a training reference voltage as described herein, and the feedback signal may be received over an additional channel 115 as described herein. In some case, the feedback signal may be received via an EDC pin, which may be included in or otherwise coupled with the additional channel 115.

At 620 the controller may configure the output driver to use an adjusted drive strength for the intermediate voltage based at least in part on the feedback signal. The operations of 615 may be performed according to the methods described with reference to FIGS. 1-5. In certain examples, the adjusted drive strength may correspond to an adjusted impedance of the driver 315.

In some examples, an apparatus as described herein may perform a method or methods, such as the method 600. The apparatus may include features, means, or instructions (e.g., a non-transitory computer-readable medium storing instructions executable by a processor) for identifying an intermediate voltage of a modulation scheme that includes three or more voltage levels, driving, using an output driver at an initial drive strength, a voltage of an output pin toward the intermediate voltage, receiving a feedback signal indicating the voltage of the output pin relative to a reference voltage corresponding to the intermediate voltage, and configuring the output driver to use an adjusted drive strength for the intermediate voltage based on the feedback signal.

In some examples of the method 600, apparatuses, and non-transitory computer-readable medium described herein, configuring the output driver to use the adjusted drive strength for the intermediate voltage may include operations, features, means, or instructions for determining an adjusted driver impedance for the intermediate voltage.

In some examples of the method 600, apparatuses, and non-transitory computer-readable medium described herein, configuring the output driver to use the adjusted drive strength for the intermediate voltage may include operations, features, means, or instructions for configuring the output driver to may have the adjusted driver impedance when driving the voltage of the output pin to the intermediate voltage.

In some examples of the method 600, apparatuses, and non-transitory computer-readable medium described herein, configuring the output driver to use the adjusted drive strength for the intermediate voltage may include operations, features, means, or instructions for configuring the output driver to use a quantity of selected legs of the output driver when driving the voltage of the output pin to the intermediate voltage, the quantity of selected legs corresponding to an amount of driver impedance.

Some examples of the method 600, apparatuses, and non-transitory computer-readable medium described herein may further include operations, features, means, or instructions for detecting a change in a logic value of the feedback signal, where determining the adjusted drive strength for the intermediate voltage includes adjusting a drive strength of the output driver to a threshold that is based at least in part on detecting the change in the logic value of the feedback signal.

Some examples of the method 600, apparatuses, and non-transitory computer-readable medium described herein may further include operations, features, means, or instructions for receiving, after configuring the output driver to use the adjusted drive strength for the intermediate voltage, a second feedback signal indicating the voltage of the output pin relative to the reference voltage and configuring the output driver to use a second adjusted drive strength for the intermediate voltage based on the second feedback signal.

Some examples of the method 600, apparatuses, and non-transitory computer-readable medium described herein may further include operations, features, means, or instructions for identifying a second intermediate voltage of the modulation scheme, driving, using the output driver at a second initial drive strength, the voltage of the output pin toward the second intermediate voltage, receiving a second feedback signal indicating the voltage of the output pin relative to a second reference voltage, the second reference voltage corresponding to the second intermediate voltage and configuring the output driver to use a second adjusted drive strength for the second intermediate voltage based on the second feedback signal.

Some examples of the method 600, apparatuses, and non-transitory computer-readable medium described herein may further include operations, features, means, or instructions for determining a lowest voltage of the modulation scheme, where the reference voltage may be based on the lowest voltage of the modulation scheme. For example, the reference voltage may be based on a difference between the highest voltage of the modulation scheme and the lowest voltage of the modulation scheme as well as a quantity of levels (e.g., an order) of the modulation scheme.

Some examples of the method 600, apparatuses, and non-transitory computer-readable medium described herein may further include operations, features, means, or instructions for driving, using the output driver at the adjusted drive strength, the voltage of the output pin to the intermediate voltage (e.g., during an operational phase).

In some examples of the method 600, apparatuses, and non-transitory computer-readable medium described herein, receiving the feedback signal may include operations, features, means, or instructions for receiving the feedback signal via an EDC pin.

In some examples of the method 600, apparatuses, and non-transitory computer-readable medium described herein, receiving the feedback signal may include operations, features, means, or instructions for receiving an indication of a logic value determined by a second device, the logic value determined based on the voltage of the output pin.

Some examples of the method 600, apparatuses, and non-transitory computer-readable medium described herein may further include operations, features, means, or instructions for detecting a boot or reboot of a device that includes the output pin, where driving, using the output driver at the initial drive strength, the voltage of the output pin toward the intermediate voltage may be based on detecting the boot or reboot.

In some examples of the method 600, apparatuses, and non-transitory computer-readable medium described herein, the modulation scheme is a PAM4 scheme that includes four voltage levels that each correspond to a symbol representative of more than one bit.

In some examples of the method 600, apparatuses, and non-transitory computer-readable medium described herein, the output pin may be a data output pin of a memory device (e.g., a DQ pin) and the feedback signal may be received from a processor (e.g., a GPU) coupled with the memory device.

In some examples of the method 600, apparatuses, and non-transitory computer-readable medium described herein, the output pin may be a data output pin of a processor (e.g., a GPU) and the feedback signal may be received from a memory device coupled with the processor.

Figure 7:
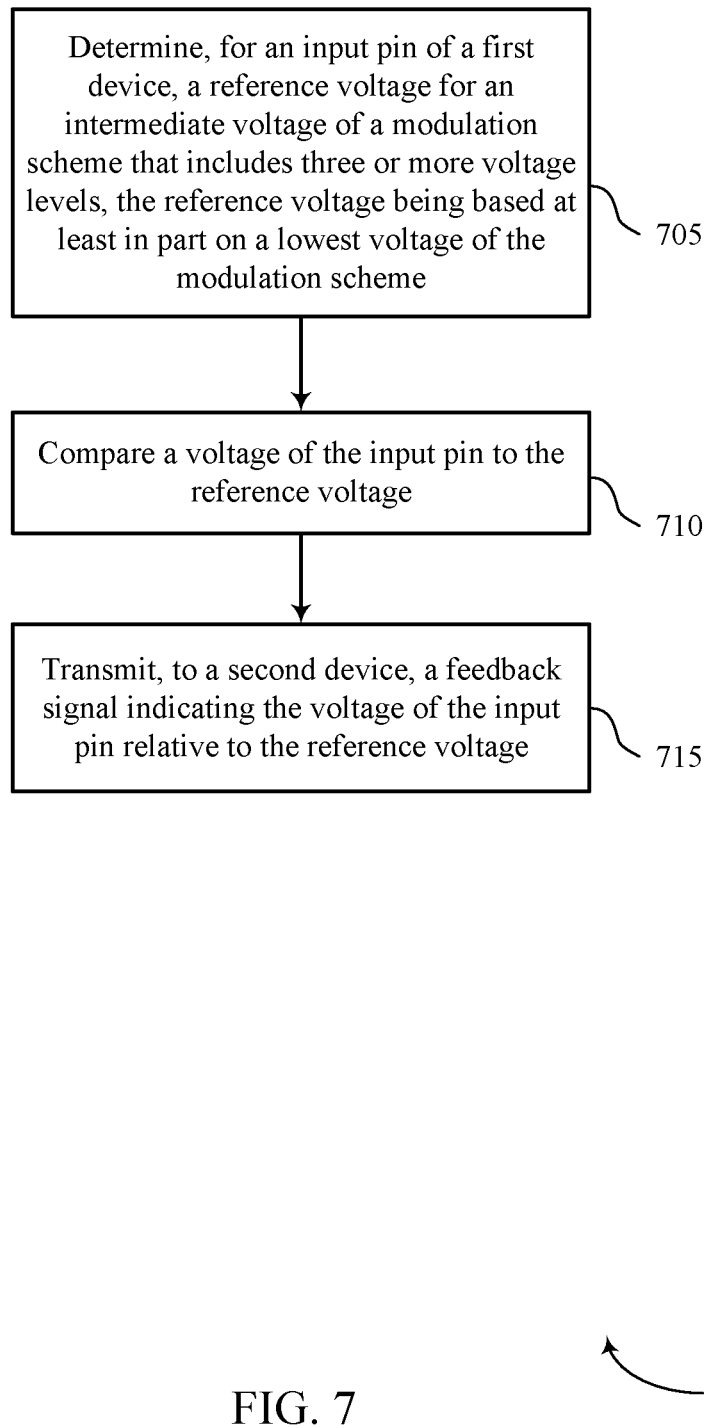

FIG. 7 shows a flowchart illustrating a method 700 that supports drive strength calibration for multi-level signaling in accordance with aspects disclosed herein. The operations of method 700 may be implemented by a controller or its components as described with reference to FIGS. 1-5. For example, the operations of method 700 may be performed by a receiving controller 335 as described with reference to FIG. 3A. In some examples, the controller may execute a set of codes to control the functional elements of a device (e.g., a receiving device 310, which may comprise a memory device 110 or a host device for the memory device 110) to perform the functions described below.

At 705 the controller may determine, for an input pin of a first device, a reference voltage for an intermediate voltage of a modulation scheme that includes three or more voltage levels, the reference voltage being based at least in part on a lowest voltage of the modulation scheme. The operations of 705 may be performed according to the methods described with reference to FIGS. 1-5. In certain examples, the modulation scheme may be a PAM4 modulation scheme, and the intermediate voltage level may be either a second-lowest or second-highest voltage level of the modulation scheme (e.g., L1 or L2). In some cases, the first device may be the receiving device 310, and the input pin may be a data pin.

At 710 the controller may compare a voltage of the input pin to the reference voltage. The operations of 710 may be performed according to the methods described with reference to FIGS. 1-5. In certain examples, the controller may configure a reference generator (such as a reference generator 330 as described with reference to FIG. 3A) to generate the reference voltage, and a comparison circuit 325 may perform the comparison and transmit a result of the comparison to the controller.

At 715 the controller may transmit, to a second device, a feedback signal indicating the voltage of the input pin relative to the reference voltage. The operations of 715 may be performed according to the methods described with reference to FIGS. 1-5. In certain examples, the second device may be a transmitting device 305 as descried with reference to FIG. 3A. In some case, the feedback signal may be transmitted via an EDC pin and an associated channel 115.

In some examples, an apparatus as described herein may perform a method or methods, such as the method 700. The apparatus may include features, means, or instructions (e.g., a non-transitory computer-readable medium storing instructions executable by a processor) for determining, for an input pin of a first device, a reference voltage for an intermediate voltage of a modulation scheme that includes three or more voltage levels, the reference voltage being based on a lowest voltage of the modulation scheme, comparing a voltage of the input pin to the reference voltage, and transmitting, to a second device, a feedback signal indicating the voltage of the input pin relative to the reference voltage.

Some examples of the method 700, apparatuses, and non-transitory computer-readable medium described herein may further include operations, features, means, or instructions for detecting a change in the voltage of the input pin that results in the voltage of the input pin crossing the reference voltage and changing a logic value of the feedback signal based on detecting the change in the voltage of the input pin.

Some examples of the method 700, apparatuses, and non-transitory computer-readable medium described herein may further include operations, features, means, or instructions for determining, for the input pin, a second reference voltage based on the lowest voltage and the reference voltage, the second reference voltage corresponding to a second intermediate voltage of the modulation scheme, comparing the voltage of the input pin to the second reference voltage and transmitting, to the second device, a second feedback signal indicating the voltage of the input pin relative to the second reference voltage.

Some examples of the method 700, apparatuses, and non-transitory computer-readable medium described herein may further include operations, features, means, or instructions for detecting a change in the voltage of the input pin that results in the voltage of the input pin crossing the reference voltage and determining to compare the voltage of the input pin to the second reference voltage based on detecting the change in the voltage of the input pin.

Some examples of the method 700, apparatuses, and non-transitory computer-readable medium described herein may further include operations, features, means, or instructions for receiving, from the second device, an indication that calibration for the intermediate voltage of the modulation scheme may be complete and determining to compare the voltage of the input pin to the second reference voltage based on the indication.

Some examples of the method 700, apparatuses, and non-transitory computer-readable medium described herein may further include operations, features, means, or instructions for determining a logic value based on the voltage of the input pin, where transmitting the feedback signal includes transmitting an indication of the logic value.

In some examples of the method 700, apparatuses, and non-transitory computer-readable medium described herein, the modulation scheme is a PAM4 scheme that includes four voltage levels that each correspond to a symbol representative of more than one bit.

In some examples of the method 700, apparatuses, and non-transitory computer-readable medium described herein, the input pin may be a data input pin of a memory device (e.g., a DQ pin) and the feedback signal may be transmitted to a processor (e.g., a GPU) coupled with the memory device.

In some examples of the method 700, apparatuses, and non-transitory computer-readable medium described herein, the input pin may be a data input pin of a processor (e.g., a GPU) and the feedback signal may be transmitted to a memory device coupled with the processor.

It should be noted that the methods described above describe possible implementations, and that the operations and the steps may be rearranged or otherwise modified and that other implementations are possible. Furthermore, aspects from two or more of the methods may be combined.

In some examples, an apparatus or device may perform aspects of the functions described herein. The device may include an output driver coupled with an output pin of the device and having a configurable impedance. The device may also include a controller in electronic communication with the output driver. The controller may be operable to cause the device to: drive, using the output driver at a first impedance, a voltage of the output pin toward an intermediate voltage of a modulation scheme that includes three or more voltage levels; receive a feedback signal indicating the voltage of the output pin relative to a reference voltage corresponding to the intermediate voltage; and configure the output driver to have a second impedance when driving the voltage of the output pin to the intermediate voltage based on the feedback signal.

In some examples, the controller may be operable to cause the device to adjust the configurable impedance of the output driver until a logic value of the feedback signal changes.

In some examples, the controller may be operable to cause the device to receive, after configuring the output driver to may have the second impedance, a second feedback signal indicating the voltage of the output pin relative to the reference voltage and configure the output driver to have a third impedance when driving the voltage of the output pin to the intermediate voltage based on the second feedback signal.

In some examples, the controller may be operable to cause the device to drive, using the output driver at a third impedance, the voltage of the output pin toward a second intermediate voltage of the modulation scheme, receive a second feedback signal indicating the voltage of the output pin relative to a second reference voltage, the second reference voltage corresponding to the second intermediate voltage, and configure the output driver to have a fourth impedance when driving the voltage of the output pin to the second intermediate voltage based on the second feedback signal.

In some examples, an apparatus or device may perform aspects of the functions described herein. The device may include an output driver coupled with an output pin of the device and having a configurable impedance. The device may also include: means for driving, using the output driver at a first impedance, a voltage of the output pin toward an intermediate voltage of a modulation scheme that includes three or more voltage levels; means for receiving a feedback signal indicating the voltage of the output pin relative to a reference voltage corresponding to the intermediate voltage; and means for configuring the output driver to have a second impedance when driving the voltage of the output pin to the intermediate voltage based at least in part on the feedback signal.

In some examples, the device may include means for adjusting the configurable impedance of the output driver until a logic value of the feedback signal changes.

In some examples, the device may include: means for receiving, after configuring the output driver to have the second impedance, a second feedback signal indicating the voltage of the output pin relative to the reference voltage; and means for configuring the output driver to have a third impedance when driving the voltage of the output pin to the intermediate voltage based at least in part on the second feedback signal.

In some examples, the device may include: means for driving, using the output driver at a third impedance, the voltage of the output pin toward a second intermediate voltage of the modulation scheme; means for receiving a second feedback signal indicating the voltage of the output pin relative to a second reference voltage, the second reference voltage corresponding to the second intermediate voltage; and means for configuring the output driver to have a fourth impedance when driving the voltage of the output pin to the second intermediate voltage based at least in part on the second feedback signal.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    determining, by a memory device based at least in part on performing a first type of calibration procedure that uses a calibration resistor, a first drive strength for a driver that communicates over a data line according to a modulation scheme that includes at least a first voltage level and a second voltage level higher than the first voltage level;
    increasing, based at least in part on determining the first drive strength for the driver using the first type of calibration procedure and as part of performing a second type of calibration procedure for the second voltage level that involves feedback from a host device, a drive strength of the driver from an initial level until the host device coupled with the driver indicates, via the feedback, that a voltage output by the driver is greater than a target voltage level; and
    determining, for the driver, a second drive strength for the second voltage level based at least in part on the host device indicating that the voltage output by the driver is greater than the target voltage level.

2. The method of claim 1, wherein the feedback comprises an output signal, the method further comprising:
    monitoring the output signal from the host device concurrent with increasing the drive strength of the driver.

3. The method of claim 2, further comprising:
    detecting, based at least in part on monitoring the output signal, a change in the output signal that indicates that the voltage output by the driver is greater than the target voltage level.

4. The method of claim 1, further comprising:
    setting the drive strength of the driver to the initial level based at least in part on determining to perform the second type of calibration procedure for the second voltage level.

5. The method of claim 1, wherein the first drive strength comprises a first impedance and the second drive strength comprises a second impedance.

6. The method of claim 1, wherein the modulation scheme comprises a pulse amplitude modulation scheme, and wherein the second voltage level represents one or more data bits.

7. A memory device, comprising:
    a driver configured to communicate over a data line according to a modulation scheme that includes at least a first voltage level and a second voltage level higher than the first voltage level, wherein the memory device is configured to:
        determine, based at least in part on performing a first type of calibration procedure that uses a calibration resistor, a first drive strength for the driver;
        increase, based at least in part on determining the first drive strength using the first type of calibration procedure and as part of performing a second type of calibration procedure for the second voltage level that involves feedback from a host device, a drive strength of the driver from an initial level until the host device indicates that a voltage output by the driver is greater than a target voltage level; and
        determine, for the driver, a second drive strength for the second voltage level based at least in part on the host device indicating that the voltage output by the driver is greater than the target voltage level.

8. The memory device of claim 7, wherein the modulation scheme comprises a pulse amplitude modulation scheme, and wherein the second voltage level represents one or more data bits.

9. The memory device of claim 7, wherein the feedback comprises an output signal, and wherein the memory device is further configured to:
    monitor the output signal from the host device concurrent with increasing the drive strength of the driver; and detect, based at least in part on monitoring the output signal, a change in the output signal that indicates that the voltage output by the driver is greater than the target voltage level.

10. The memory device of claim 7, wherein the memory device is further configured to:
set the drive strength of the driver to the initial level based at least in part on determining to perform the second type of calibration procedure for the second voltage level.

11. A method, comprising:
determining, by a memory device based at least in part on performing a first type of calibration procedure that uses a calibration resistor, a first drive strength for a driver that communicates over a data line according to a pulse amplitude modulation scheme that includes at least a lowest voltage level, a highest voltage level, and an intermediate voltage level between the lowest voltage level and the highest voltage level;
increasing, based at least in part on determining the first drive strength for the driver using the first type of calibration procedure and as part of a second type of calibration procedure for the intermediate voltage level that involves feedback from a host device, a drive strength of the driver from an initial level until host device coupled with the driver indicates, via the feedback, that a voltage output by the driver is greater than a target voltage level; and
determining, for the driver, a second drive strength for the intermediate voltage level based at least in part on the host device indicating that the voltage output by the driver is greater than the target voltage level.

12. The method of claim 11, wherein the first drive strength corresponds to the lowest voltage level for the pulse amplitude modulation scheme.

13. The method of claim 11, wherein the pulse amplitude modulation scheme includes a second intermediate voltage level that is between the intermediate voltage level and the highest voltage level.

14. The method of claim 13, further comprising:
selecting the intermediate voltage level for the calibration procedure based at least in part on the intermediate voltage level being closer to the lowest voltage level than the second intermediate voltage level.

15. The method of claim 13, further comprising:
determining to perform a second calibration procedure of the second type for the second intermediate voltage level based at least in part on determining the second drive strength for the intermediate voltage level.

16. The method of claim 11, wherein the target voltage level selected based at least in part on the lowest voltage level and the highest voltage level.

17. The method of claim 11, further comprising:
determining a third drive strength for the highest voltage level based at least in part on the calibration resistor.

* * * * *